US006271463B1

(12) United States Patent
Kultzow et al.

(10) Patent No.: US 6,271,463 B1
(45) Date of Patent: Aug. 7, 2001

(54) USE OF EXPANDABLE EPOXY SYSTEMS FOR BARRIER MATERIALS IN HIGH VOLTAGE LIQUID-FILLED TRANSFORMERS

(75) Inventors: Robert John Kultzow; Mangesh Yeshwant Rajadhyaksha, both of Okemos; Luciano Pilato, Haslett; William Bin Ferng, Novi, all of MI (US)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/327,859

(22) Filed: Jun. 8, 1999

Related U.S. Application Data

(60) Provisional application No. 60/088,417, filed on Jun. 8, 1998.

(51) Int. Cl.[7] ..................................................... H05K 5/06

(52) U.S. Cl. .................................. 174/17 LF; 174/17 R; 174/110 PM; 336/55

(58) Field of Search ................................ 336/55, 57, 58; 174/17 R, 50, 110 PM

(56) References Cited

U.S. PATENT DOCUMENTS

| | | | | |
|---|---|---|---|---|
| 3,585,552 | * | 6/1971 | Feather et al. | 336/58 |
| 3,601,689 | * | 8/1971 | Kettler | 323/43.5 S |
| 3,611,225 | * | 10/1971 | Dakin | 336/58 |
| 3,934,332 | * | 1/1976 | Trunzo | 29/605 |
| 3,941,725 | | 3/1976 | Schmitter et al. | 260/2.5 |
| 4,095,205 | * | 6/1978 | Schoeder et al. | 336/92 |
| 4,199,909 | * | 4/1980 | Kotcharian | 52/410 |
| 4,275,372 | * | 6/1981 | Eley | 337/4 |
| 4,278,738 | * | 7/1981 | Brax et al. | 428/515 |
| 4,353,954 | * | 10/1982 | Yamaoka et al. | 428/216 |
| 4,568,603 | | 2/1986 | Oldham | 428/195 |
| 4,713,032 | | 12/1987 | Frank | 441/74 |
| 4,741,947 | | 5/1988 | Pataki | 428/211 |
| 4,795,665 | * | 1/1989 | Lancaster et al. | 428/246 |
| 4,879,441 | * | 11/1989 | Hamm et al. | 200/144 B |

(List continued on next page.)

FOREIGN PATENT DOCUMENTS

| | | |
|---|---|---|
| 2 348 985 | 4/1974 | (DE) . |
| 28 50 342 | 12/1982 | (DE) . |
| 31 18 631 | 11/1983 | (DE) . |
| 33 29 230 | 7/1986 | (DE) . |
| 35 37 703 | 9/1992 | (DE) . |
| 064937 | 11/1982 | (EP) . |
| 0 365 479 | 4/1990 | (EP) . |

OTHER PUBLICATIONS

Patent abstracts of Japan, JP 54141823.

Derwent Abstract No. 00378J [47] (1982) of DE 3 118 631 and EP 64,937.

Derwent Abstract No. 32950V[18] (1974) of DE 2,348,985.

Derwent Abstract No. 40106C[23] (1980) of DE 2,850,342.

*Primary Examiner*—Dean A. Reichard
*Assistant Examiner*—Angel R. Estrada
(74) *Attorney, Agent, or Firm*—Lyon & Lyon LLP; Kristin H. Neuman; James H. Shalek

(57) ABSTRACT

The present invention relates to a high voltage liquid-filled transformer including a housing and a dielectric liquid impregnated barrier material within the housing. The barrier material is prepared from an expandable epoxy resin formulation comprising: (i) at least one polyglycidyl compound; (ii) at least one curing agent for the polyglycidyl compound; and (iii) at least one blowing agent. An additional aspect of the present invention is a novel barrier component for a liquid-filled transformer. The present invention also relates to a method for manufacturing the novel barrier component. The present invention also relates to a method of manufacturing the transformer.

5 Claims, 1 Drawing Sheet

U.S. PATENT DOCUMENTS

| | | | | |
|---|---|---|---|---|
| 5,023,406 | | 6/1991 | Thornley | 174/209 |
| 5,268,223 | | 12/1993 | Qureshi et al. | 428/283 |
| 5,300,912 | | 4/1994 | Tillery et al. | 337/180 |
| 5,368,929 | | 11/1994 | Parker et al. | 428/305.5 |
| 5,440,446 | | 8/1995 | Shaw et al. | 361/301.5 |
| 5,446,242 | | 8/1995 | Barrett | 174/140 |
| 5,612,424 | * | 3/1997 | Sato et al. | 525/530 |
| 5,637,831 | | 6/1997 | Lambeth | 174/209 |
| 5,648,132 | | 7/1997 | Abe et al. | 428/36.9 |

* cited by examiner

USE OF EXPANDABLE EPOXY SYSTEMS FOR BARRIER MATERIALS IN HIGH VOLTAGE LIQUID-FILLED TRANSFORMERS

This application claims the benefit under 35 U.S.C. 119(e) of U.S. Provisional Application No. 60/088,417, Filed Jun. 8, 1998.

The present invention relates to improved barrier components for use in high voltage liquid-filled transformers. The barrier components are prepared from expandable epoxy systems or laminated structures of alternating layers of expandable epoxy resin matrix and substrate material. The present invention further relates to methods for preparing said barrier materials and the use thereof in high voltage liquid-filled transformers.

BACKGROUND

Liquid-filled transformers have historically used cellulose paper as a primary solid electrical sheet insulation. Cellulose paper has several shortcomings, such as moisture absorption, water generation, and limited thermal capabilities. Cellulose paper must be thoroughly dried prior to impregnation under vacuum with a transformer or dielectric liquid. Accordingly, the manufacturing process for high voltage transformers with liquid impregnated cellulose paper is lengthy and labor intensive. Following the heat and vacuum process, the cellulose is typically impregnated with mineral oil to slow the re-absorption of moisture. Water generation occurs as the cellulose ages due to heat. Water generation results in reduced dielectric strength of the oil, and may eventually cause a transformer to fail.

High voltage transformers must be manufactured to very precise dimensional tolerances. Dimensional instability can produce significant electrical losses. Cellulose materials also exhibit a high degree of mechanical creep and measurable deformation from long term static loads and dynamic loads. Additionally, natural cellulose can react with transformer oils to form acid by-products which in turn can cause accelerated degradation of electrical insulation.

In view of these shortcomings of cellulose paper, there is a need in the field for improved barrier materials for use in high voltage liquid-filled transformers.

SUMMARY OF THE INVENTION

The present invention relates to a high voltage liquid-filled transformer including a housing and a dielectric liquid impregnated barrier material within the housing. The barrier material is prepared from an expandable epoxy resin formulation comprising: (i) at least one polyglycidyl compound; (ii) at least one curing agent for the polyglycidyl compound; and (iii) at least one blowing agent. Preferably, the dielectric liquid impregnated barrier material is a laminated structure of alternating layers of cured expandable epoxy resin formulation and a substrate material.

An additional aspect of the present invention is a barrier component for a liquid-filled transformer that is a dielectric liquid impregnated barrier material prepared from an expandable epoxy resin formulation. The expandable epoxy resin formulation contains (i) at least one polyglycidyl compound, (ii) at least one curing agent for the polyglycidyl compound, and (iii) at least one blowing agent. Preferably, the barrier component further comprises at least one layer of a substrate material, more particularly, the substrate material is at least one ply of a non-woven polyester material.

The present invention further relates to a method of manufacturing the barrier component by reacting (i) at least one polyglycidyl compound and (ii) at least one curing agent for the polyglycidyl compound in the presence of at least one blowing agent to produce a porous solid article.

The present invention also relates to a method for manufacturing the barrier component having multiple laminated layers by blending (i) at least one polyglycidyl compound and (ii) at least one curing agent for the polyglycidyl compound in the presence of at least one blowing agent to produce a foamable resin system. A first layer and a second layer of the foamable resin system are then applied onto each major surface of a first substrate layer to produce a laminated structure. The laminated structure is then subjected to heat and pressure as the first and second layer of the foamable resin system react.

The present invention also relates to a method of manufacturing the transformer by reacting (i) at least one polyglycidyl compound and (ii) at least one curing agent for the polyglycidyl compound in the presence of at least one blowing agent to produce a porous solid article. The porous solid article is then fitted for and placed within a housing on the transformer and subsequently impregnated with a dielectric liquid.

In an alternative embodiment, the present invention relates to a method for manufacturing the transformer by blending (i) at least one polyglycidyl compound and (ii) at least one curing agent for the polyglycidyl compound in the presence of at least one blowing agent to produce a foamable resin system. A first layer and a second layer of the foamable resin system are then applied onto each major surface of a first substrate layer to produce a laminated structure. The laminated structure is then subjected to heat and pressure as the first and second layer of the foamable resin system react. The resulting laminated structure is fitted for and placed within a transformer housing and subsequently impregnated with a dielectric liquid.

DETAILED DESCRIPTION OF THE INVENTION

Figure 1:
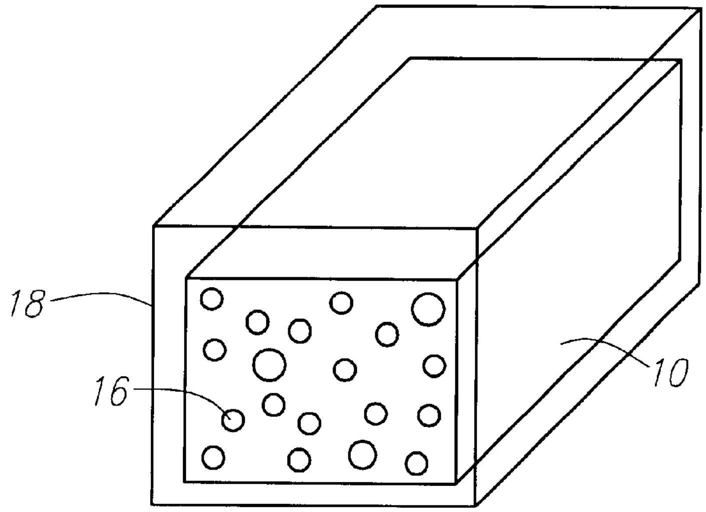
FIG. 1 is a cross sectional view of a section of an expanded epoxy barrier material within a housing.

The present invention relates to an improved barrier material for use in high voltage liquid-filled transformers. FIG. 1 shows a cross sectional view of a section of barrier material 10 within a housing 18 prepared in accordance with the instant invention. The section of barrier material 10 shown in FIG. 1 is rectangular, though those skilled in the art will recognize that an entire barrier material component containing said barrier material 10 will be shaped to fit within the housing of a high voltage liquid-filled transformer.

Barrier material 10 is prepared from a foamable epoxy resin formulation containing at least one polyglycidyl compound, at least one curing agent, at least one blowing agent, and optionally fillers and customary additives for epoxy resin formulations. Suitable polyglycidyl compounds have a low viscosity at room temperature and, on average, more than one glycidyl group per molecule.

Polyglycidyl esters and poly(β-methylglycidyl) esters are one example of suitable polyglycidyl compounds. Said polyglycidyl esters are obtained by reacting a compound having at least two carboxyl groups in the molecule with epichlorohydrin or glycerol dichlorohydrin or β-methylepichlorohydrin. The reaction is expediently carried out in the presence of bases. The compounds having at least two carboxyl groups in the molecule can in this case be, for example, aliphatic polycarboxylic acids, such as glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, can be used.

Polyglycidyl ethers or poly(β-methylglycidyl) ethers obtained by reacting a compound having at least two free alcoholic hydroxyl groups and/or phenolic hydroxyl groups with a suitably substituted epichlorohydrin under alkaline conditions or in the presence of an acidic catalyst followed by alkali treatment can likewise be used. Polyglycidyl ethers of this type are derived, for example, from acyclic alcohols, such as ethylene glycol, diethylene glycol and higher poly (oxyethylene) glycols, propane-1,2-diol, or poly (oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained, however, from cycloaliphatic alcohols, such as 1,3- or 1,4-dihydroxycyclohexane, bis(4-hydroxycyclo-hexyl)methane, 2,2-bis(4-hydroxycyclohexyl)propane or 1,1 -bis(hydroxymethyl) cyclohex-3-ene, or they possess aromatic rings, such as N,N-bis(2-hydroxyethyl)aniline or p,p'-bis(2-hydroxyethylamino)diphenylmethane.

Particularly preferred representatives of polyglycidyl ethers or poly(β-methylglycidyl) ethers are based on phenols; either on monocylic phenols, for example on resorcinol or hydroquinone, or on polycyclic phenols, for example on bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks.

Poly(N-glycidyl) compounds are likewise suitable for the purposes of the present invention and are obtained, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl) methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Poly(S-glycidyl) compounds are also suitable polyglycidyl compounds for use in the present invention, examples being di-S-glycidyl derivatives derived from dithiols, for example ethane-1,2-dithiol or bis(4-mercaptomethylphenyl) ether.

Examples of epoxide compounds in which the epoxide groups form part of an alicyclic or heterocyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexyl-methyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexane-carboxylate, ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

However, it is also possible to employ epoxy resins in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis (5,5-dimethyl-1-glycidylhydantoin-3-yl)propane.

Also conceivable is the use of liquid prereacted adducts of epoxy resins, such as those mentioned above, with hardeners for epoxy resins.

Mixtures of substituted and unsubstituted low viscosity bisphenol-A resins, cycloaliphatic polyglycidyl resins, non-advanced polyglycidyl ethers of 2,2-bis(4'-hydroxyphenyl) propane bisphenol A), 2,2'-bis(3'-5'-dibromo-4'-hydroxyphenyl)methane (tetrabromobisphenol A), bis(4-hydroxyphenyl)methane (bisphenol F), and advanced novolaks thereof are preferred. A resulting resin formulation must have sufficiently low viscosity to allow the incorporation of fillers, particularly silica, fumed silica, calcium carbonate, calcium silicate, most preferably fumed silica, in order to control porosity. Mixtures of resins can be used. Preferably, at least one of the polyglycidyl compounds is substituted at one or more positions with a halogen, more preferably bromine or chlorine.

The above polyglycidyl compounds can be cured using either basic or acidic curing agents. The hardener should have low reactivity and produce a low exothermic curing reaction that can be initiated at room temperature. Examples of basic curing agents are Lewis bases, primary and secondary amines, such as diethanolamine, ethyl- and methylethanolamine, dimethylamine, diethylamine, methylethylamine, and methyl-n-propylamine, piperidine, and piperazines, cycloaliphatic amines, such as isophorone diamine, 4,4'-methylenebiscyclohexamine, and aromatic primary amines, such as phenylenediamine, methylenedianiline, and diaminodiphenysulfone, and amides, such as dicyandiamide and acrylamide. The acid curing agents are carboxylic acid anhydrides, dibasic organic acids, phenols, and Lewis acids. The preferred curing agents are mixtures of primary, secondary and tertiary amines (catalyst). Anhydride curing agents, while suitable for certain applications, tend to require at least modest heating to initiate the curing reaction. A sufficient amount of curing agent is added to the composition to fully cure the epoxy resin component.

The blowing agent employed herein produces a froth as the entire resin formulation cures. The foaming agent can be a chemical blowing agent, such as a methylhydrogen siloxane, halogenated hydrocarbon, monoflurotrichloromethane, difluorodichloromethane, trichlorotrifluoromethanes, dichlorotetrafluoroethane, methylene chloride, chloroform, carbon tetrachloride, and mixtures thereof, inert gas, or low boiling solvents. The amount of blowing agent employed can be varied over a wide range depending on the degree of desired porosity. Generally, the blowing agent is employed in the amount of up to about 5% by weight, preferably about 3% by weight. More preferably, the amount of blowing agent is employed in amounts of about 0.5 to about 3 parts by weight. The degree of foaming (and resulting porosity), however, depends on the process conditions, particularly the cure temperature, as well as the amount of blowing agent. Under the conditions described above, the best results, as far as partial discharge and compressive creep, were obtained by using about 1 part of blowing agent per 100 parts by weight of resin component.

Customary additives, such as fumed silica and polyether modified silicones, can be further incorporated into the overall formulation.

The overall formulation contains between about 60 to 85% by weight of at least one polyglycidyl compound, between about 5 to 10% by weight of at least one curing agent, and up to 5% by weight of blowing agent, the balance to 100% optionally being fillers and customary additives.

The improved barrier material is prepared by blending the at least one polyglycidyl compound, at least one blowing agent, at least one curing agent and optionally, fillers and customary additives in a reactor vessel. As the polyglycidyl compound(s) react with the curing agent(s), the blowing agent(s) produces a froth throughout the matrix. Ultimately, the formulation cures into a solid form having voids 16 with a desired degree of porosity. The porous solid form can then be cut and trimmed to fit within a transformer. A dielectric liquid is then impregnated into the trimmed porous solid to produce a final barrier material component fitted within the housing of a transformer.

Figure 2:
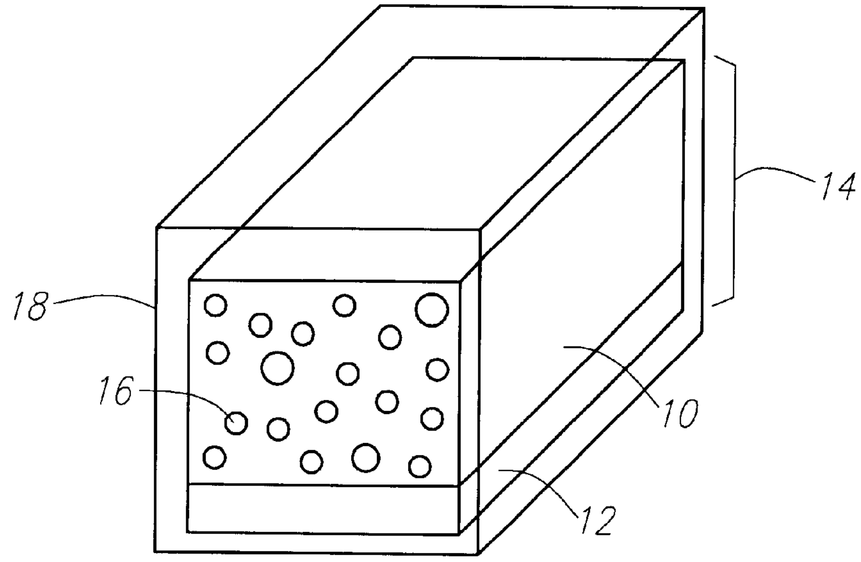
FIG. 2 is a cross sectional view of a laminated structure containing an expanded epoxy barrier material layer, within a housing.

Referring to FIG. 2, which shows an alternative embodiment, the barrier material described above is provided between layers of a substrate 12 to produce a laminated structure 14 within the housing 18. Substrate 12 is preferably a non-woven high density thermally bonded polyester mat. In order to prepare laminated structure 14, a desired quantity of curable epoxy resin formulation is prepared by blending at least one polyglycidyl compound, at least one blowing agent, at least one curing agent, and optionally, fillers and customary additives in a reactor vessel. A first layer of substrate 12 is coated with the curable formulation and positioned on a support with the wetted side down. The exposed side of substrate 12 is then coated with a second layer of curable formulation. A second layer of substrate 12 is then immediately placed atop the second layer of curable formulation. A third layer of curable formulation is then provided over the exposed surface of the second layer of substrate 12. A securing means is provided over the resulting multilayer structure. Preferably, a release coating is applied on the interior wetted surfaces of the support and securing means.

The resulting multilayer structure within the support and securing means is then placed in a heated platen press. The press preferably is heated to a temperature of between 95° C. and 140° C. The press applies a pressure of about 90 to 120 psi for a period of 8 to 15 minutes. Again, as the polyglycidyl compound(s) react with the curing agent(s), the blowing agent creates a froth. The resulting cured object has voids 16, which produce a desired degree of porosity in the cured object. The cured object is trimmed to fit with the housing of a transformer and vacuum impregnated with a dielectric liquid to produce an alternative improved barrier component.

The present invention will be further understood by reference to the following non-limiting examples. The components listed below correspond to the components listed in the examples:

| Tradename | Chemical Name and Description |
|---|---|
| Araldite ® LY 5054 | modified epoxy resin |
| Araldite ® CY 9579 | epoxy resin based on diglycidylether of bisphenol A |
| Araldite ® EPN 1138CS | phenol novolac epoxy resin |
| HY 5003 | modified aliphatic amine |
| DY 5054 | foaming agent-methyl hydrogen siloxane CAS No. 63148-57-2, which in the presence of an amine, releases hydrogen gas |

EXAMPLE 1

240 grams of an expandable epoxy system is prepared at room ambient temperature as a blend of the following: 100 parts by weight of Araldite® LY 5054, available from Ciba Specialty Chemicals Corporation, East Lansing, Mich., 20 parts by weight of hardener HY 5003, available from Ciba Specialty Chemicals Corporation, East Lansing, Mich., and about 1 parts by weight of a chemical blowing agent, DY 5054, available from Ciba Specialty Chemicals Corporation. The system is a free flowing liquid with a working life of approximately 20 minutes at room ambient temperature.

12 plies of unsized, apertured, non-woven polyester veil are pre-cut to a size of 10 inches by 10 inches.

Immediately after preparing the system described above, an 80 gram quantity is poured directly on a stack of 6 plies of the polyester veil and then manually spread over the entire surface. The coated stack is positioned wet side down onto a stainless steel caul plate (⅛") thick that has been coated with a suitable epoxy mold release. Immediately thereafter, another 80 grams of the system material is poured onto the top of the first coated stack and manually spread uniformly over its surface. The remaining 6 plies of polyester veil are aligned and placed atop the second layer of system material. Finally, an additional 80 grams of the system material are poured onto the top most layer of polyester veil and manually spread over its surface. A second stainless steel caul plate (⅛") coated with a suitable epoxy mold release is placed over the final layer of system material. Spacers of a thickness of ⅛" are placed in all four corners of the assembly between the caul plates.

The assembly is placed in a vertical hydraulic press having a platen temperature of between 95° C. to 105° C. and pressed to a thickness of ⅛" by the application of 90 to 120 psi pressure. The dwell time in the press ranges from 8 to 15 minutes. During this time, the curing system is infused with gas bubbles, forming a froth from the action of the chemical blowing agent and simultaneously crosslinked to form a non-fusible solid by the reaction of the epoxy resin and the curing agent. The laminate is then removed from the press, trimmed, and postcured for 30 minutes at 130° C. to attain to attain more complete chemical crosslinking.

EXAMPLE 2

256 grams of an expandable epoxy system with a higher glass transition temperature was prepared at room ambient temperature as a blend of the following: 90 parts by weight of Araldite® CY 9579, available from Ciba Specialty Chemicals Corporation, 10 parts by weight of Araldite® EPN 1138CS, available from Ciba Specialty Chemicals Corporation, 28 parts by weight of 4,4'-methylenebiscyclohexaneamine, available from Air Products and Chemicals, Allentown, Pa., and about 1 parts by weight of a chemical blowing agent, DY 5054, available from Ciba Specialty Chemicals Corporation.

In a manner described above in example 1, a laminate is prepared with a total of 12 plies of an unsized, apertured, non-woven polyester veil precut to a size of 10 inches by 10 inches. The laminate is placed in a vertical hydraulic press having platen temperatures of 120° C. to 130° C. and pressed to a thickness of ⅛" by the application of 90–120 psi pressure. The dwell time in the press ranges from 8 to 15 minutes. During this time, the curing system is infused with gas bubbles, forming a froth from the action of the chemical blowing agent and simultaneously crosslinked to form a non-fusible solid by the reaction of the epoxy resin and the curing agent. The laminate is then removed from the press, trimmed, and postcured for 2 hours at 160° C. to attain more complete chemical crosslinking. A greater degree of crosslinking leads to a higher glass transition temperature. Applicants have discovered that production of a cured article having a glass transition temperature in excess of 130° C, preferably more than about 140° C, leads to significantly better creep strength characteristics.

We claim:

1. A high voltage liquid-filled transformer prepared by a) supplying a housing;

b) producing a foamable resin system by blending, in the presence of at least one blowing agent,
   i) at least one polyglycidyl compound; and
   ii) at least one curing agent for the polyglycidyl;

c) applying a first and second layer of the foamable resin system onto each major surface of a first substrate layer to produce a laminated structure;

d) subjecting the laminated structure to heat and pressure as the first and second layer of the foamable resin system react;

e) fitting the laminated structure within the housing; and f) impregnating the fitted laminated structure with a dielectric liquid.

2. A barrier component for a liquid-filled transformer prepared by a) producing a foamable resin system by blending, in the presence of at least one blowing agent,
   b) at least one polyglycidyl compound; and
   ii) at least one curing agent for the polyglycidyl;

b) applying a first and second layer of the foamable resin system onto each major surface of a first substrate layer to produce a laminated structure; and c) subjecting the laminated structure to heat and pressure as the first and second layer of the foamable resin system react.

3. A barrier component according to claim 2 wherein the substrate material is at least one ply of a non-woven polyester material.

4. A method for manufacturing a barrier component for a liquid-filled transformer comprising:

a) blending
   (i) at least one polyglycidyl compound; and
   (ii) at least one curing agent for the polyglycidyl compound in the presence of at least one blowing agent to produce a foamable resin system;

b) applying a first layer and second layer of the foamable resin system onto each major surface of a first substrate layer to produce a laminated structure;

c) subjecting the laminated structure to heat and pressure as the first and second layer of the foamable resin system react.

5. A method for manufacturing a high voltage liquid-filled transformer comprising:

a) blending
   (i) at least one polyglycidyl compound; and
   (ii) at least one curing agent for the polyglycidyl compound in the presence of at least one blowing agent to produce a foamable resin system;

b) applying a first layer and second layer of the foamable resin system onto each major surface of a first substrate layer to produce a laminated structure;

c) subjecting the laminated structure to heat and pressure as the first and second layer of the foamable resin system react;

d) fitting the laminated structure into the housing; and e) impregnating the fitted laminated structure with a dielectric liquid.

* * * * *